(12) United States Patent
Liu et al.

(10) Patent No.: US 11,050,239 B2
(45) Date of Patent: Jun. 29, 2021

(54) METHOD AND CONTROL SYSTEM FOR FAULT DIRECTION DETECTION

(71) Applicant: ABB Power Grids Switzerland AG, Baden (CH)

(72) Inventors: Kai Liu, Beijing (CN); Jianping Wang, Vasteras (SE); Youyi Li, Vasteras (SE)

(73) Assignee: ABB Power Grids Switzerland AG, Baden (CH)

( * ) Notice: Subject to any disclaimer, the term of this patent is extended or adjusted under 35 U.S.C. 154(b) by 94 days.

(21) Appl. No.: 16/418,105

(22) Filed: May 21, 2019

(65) Prior Publication Data
US 2019/0271730 A1 Sep. 5, 2019

Related U.S. Application Data

(63) Continuation of application No. PCT/CN2017/072045, filed on Jan. 22, 2017.

(51) Int. Cl.
*G01R 31/50* (2020.01)
*H02H 3/16* (2006.01)
(Continued)

(52) U.S. Cl.
CPC .......... *H02H 3/165* (2013.01); *G01R 31/085* (2013.01); *H02H 1/0007* (2013.01); *H02H 7/26* (2013.01);
(Continued)

(58) Field of Classification Search
CPC ..... H02H 3/165; H02H 1/0007; G01R 31/085
See application file for complete search history.

(56) References Cited

U.S. PATENT DOCUMENTS 6,601,001 B1 * 7/2003 Moore ................... G01R 31/08
702/58
6,798,211 B1 9/2004 Rockwell et al.
(Continued)

FOREIGN PATENT DOCUMENTS

CN 1195775 A 10/1998
CN 101252273 A 8/2008
(Continued)

OTHER PUBLICATIONS

State Intellectual Property Office of the P.R. China, International Search Report & Written Opinion issued in corresponding Application No. PCT/CN2017/072045, dated Nov. 9, 2017, 9 pp.
(Continued)

*Primary Examiner* — Alvaro E Fortich
(74) *Attorney, Agent, or Firm* — Slater Matsil, LLP

(57) ABSTRACT

A method for detecting fault direction of a transmission line of an AC power system and a control system using the same. The method includes sampling current values and voltage values at one end of the transmission line for a series of time points; computing instantaneous voltage values at compensated point on the transmission line from the current value samples and the voltage value samples based on a time domain lumped parameter differential equation for the transmission line for the series of time points; recording the current value samples and the computed instantaneous voltage values at the compensated point; computing at least one voltage fault component each using the recorded computed instantaneous voltage values for at least the at least two of the series of time points; identifying the fault direction in consideration of the at least one computed voltage fault component and the at least one computed current fault component; and generating a fault direction signal indicating the identified fault direction. Where a fault directional element is designed using the voltage fault components at
(Continued)

the compensated point, it will work well for the AC power system with strong power source.

20 Claims, 3 Drawing Sheets

(51) Int. Cl.
 *H02H 1/00* (2006.01)
 *H02H 7/26* (2006.01)
 *G01R 31/08* (2020.01)
 *H02H 3/38* (2006.01)
 *G01R 19/25* (2006.01)
 *H02H 3/08* (2006.01)
(52) U.S. Cl.
 CPC ......... *G01R 19/2513* (2013.01); *H02H 3/081* (2013.01); *H02H 3/385* (2013.01)

(56) References Cited

U.S. PATENT DOCUMENTS

| | | | |
|---|---|---|---|
| 9,250,282 | B2 | 2/2016 | Ukil et al. |
| 2011/0286361 | A1 | 11/2011 | Li et al. |
| 2012/0147941 | A1 | 6/2012 | Su et al. |
| 2013/0107405 | A1 | 5/2013 | Blumschein et al. |
| 2016/0077149 | A1* | 3/2016 | Schweitzer, III ...... G01R 31/08 307/131 |
| 2017/0102426 | A1* | 4/2017 | Schweitzer, III ...... G01R 31/11 |

FOREIGN PATENT DOCUMENTS

| | | |
|---|---|---|
| CN | 101478148 A | 7/2009 |
| CN | 101701999 A | 5/2010 |
| CN | 101701999 B | 7/2011 |
| CN | 102288874 A | 12/2011 |
| CN | 102308529 A | 1/2012 |
| CN | 102354962 A | 2/2012 |
| CN | 102652409 A | 8/2012 |
| CN | 102985836 A | 3/2013 |
| CN | 103109429 A | 5/2013 |
| CN | 103207353 A | 7/2013 |
| CN | 103245874 A | 8/2013 |
| CN | 103245887 A | 8/2013 |
| CN | 103474980 A | 12/2013 |
| CN | 103760470 A | 4/2014 |
| CN | 103760471 A | 4/2014 |
| CN | 103762564 A | 4/2014 |
| CN | 104535890 A | 4/2015 |
| CN | 105259473 A | 1/2016 |
| CN | 105353251 A | 2/2016 |
| EP | 2278676 A1 | 1/2011 |
| EP | 2624397 B1 | 4/2014 |
| EP | 2603960 B1 | 2/2015 |
| JP | S6122265 A | 1/1986 |
| KR | 101317561 B1 | 10/2013 |
| KR | 101463045 B1 | 11/2014 |
| KR | 105518958 A | 4/2016 |
| WO | 2012003888 A1 | 1/2012 |
| WO | 2016044469 A1 | 3/2016 |

OTHER PUBLICATIONS

Schweitzer, III et al., "Speed of Line Protection—Can We Break Free of Phasor Limitations," Schweitzer Engineering Laboratories, Inc., 2014, 14 pp.

Blumschein et al., "Directional Comparison based on High-Speed-Distance Protection using Delta Quantities," Siemens AG, Infrastructure & Cities Sector, 7 pp.

Benteng et al., "Principle and Property Research of the Energy Directional Protection," Proceedings of the CSEE, vol. 17, No. 3, May 1997, English Abstract Included, 5 pp.

* cited by examiner

METHOD AND CONTROL SYSTEM FOR FAULT DIRECTION DETECTION

TECHNICAL FIELD

The invention relates to detecting faults in AC power system, and more particularly to fault direction detection in the AC power system.

BACKGROUND ART

AC power system has been widely deployed to supply, transfer, and use electric power. It may experience issues with stability during disturbances, such as short circuits, loss of generation, loss of load, open circuits, or any combination thereof. One of the solutions of these issues is to employ protection relays operating in high speed trigged assisted with fault direction signal.

Traditionally, fault direction may be detected based on local measurements of fault components at an end of the transmission line of the AC power system. An example of such fault direction detection mechanism is disclosed in "Principle and Property Research of the Energy Directional Protection", He Benteng, Jin Huafeng and Li Ju, Proceedings of the CSEE, Vol. 17 No. 3, May. 1997.

However, under the condition of strong system where the power source approximates to an AC voltage source, the AC voltage is maintained at the end of the transmission line coupled to the power source even if a fault occurs with the AC power system. It turns out that a voltage fault component determined from the voltage measurement at the end of the transmission line may be insignificant for fault direction identification.

Therefore, the conventional solution suffers at least the disadvantage of poor sensitivity for detection of fault direction in strong AC power system. This may finally lead to fail to trip the circuit breaker in a faulted AC power system.

BRIEF SUMMARY OF THE INVENTION

According to one aspect of present invention, it provides a method for detecting fault direction of transmission line of an AC power system, including: sampling current values and voltage values at one end of the transmission line for a series of time points; computing instantaneous voltage values at compensated point on the transmission line from the current value samples and the voltage value samples based on a time domain lumped parameter differential equation for the transmission line for the series of time points; recording the current value samples and the computed instantaneous voltage values at the compensated point; computing at least one voltage fault component each using the recorded computed instantaneous voltage values for at least two of the series of time points; computing at least one current fault component each using the recorded current value samples for the at least two of the series of time points; identifying the fault direction in consideration of the at least one computed voltage fault component and the at least one computed current fault component; and generating a fault direction signal indicating the identified fault direction.

According to another aspect of present invention, it provides a control system for detecting fault direction of transmission line of an AC power system, including: a sampling circuit, for sampling current values and voltage values at one end of the transmission line for a series of time points; a controller, for computing instantaneous voltage values at compensated point on the transmission line from the current value samples and the voltage value samples based on a time domain lumped parameter differential equation for the transmission line for the series of time points; and a storage circuit, for recording the current value samples and the computed instantaneous voltage values at the compensated point; wherein: the controller is further adapted for: computing at least one voltage fault component each using the recorded computed instantaneous voltage values for at least two of the series of time points; computing at least one current fault component each using the recorded current value samples for the at least two of the series of time points; identifying the fault direction in consideration of the at least one computed voltage fault component and the at least one computed current fault component; and generating a fault direction signal indicating the identified fault direction.

Based on the principle of time domain lumped parameter differential equation for the transmission line, instantaneous voltage values at the compensation point can be calculated from the sampling current values and voltage values at one end of the transmission line for a series of time points, including three instantaneous voltage values of phase-ground loop electric signals and three instantaneous voltage values of phase-phase loop electric signals. Namely, a mathematical link can be established based on the relations between the values of the sampled electric signals measured at the measurement point and computed instantaneous voltage values at the compensation point. The two groups of discrete values concerning the voltage fault component at the end of the transmission line and the voltage fault component at the compensated point on the transmission line exhibit a positive correlation in the time domain, the discrete values for the same sampling instant of the two groups having the same polarity for a predetermined time period. Furthermore, for any sampling instant of the predetermined time period, the discrete value of the voltage fault component at the compensated point always has a larger amplitude than that of the voltage fault component at the one end of the transmission line. A larger magnitude is more easily to be detected than a smaller one, especially in a strong AC power system where the voltage fault components at the one end of the transmission line have insignificant amplitudes. In consideration of such positive correlation and the larger amplitudes of the discrete values of the voltage fault components at the compensated point, by observing the voltage fault components at the compensated point rather than the voltage fault components at the one end of the transmission line, the fault information may be identified accurately from significant signals. Where a fault directional element is designed using the voltage fault components at the compensated point, it will work well for the AC power system with strong power source.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
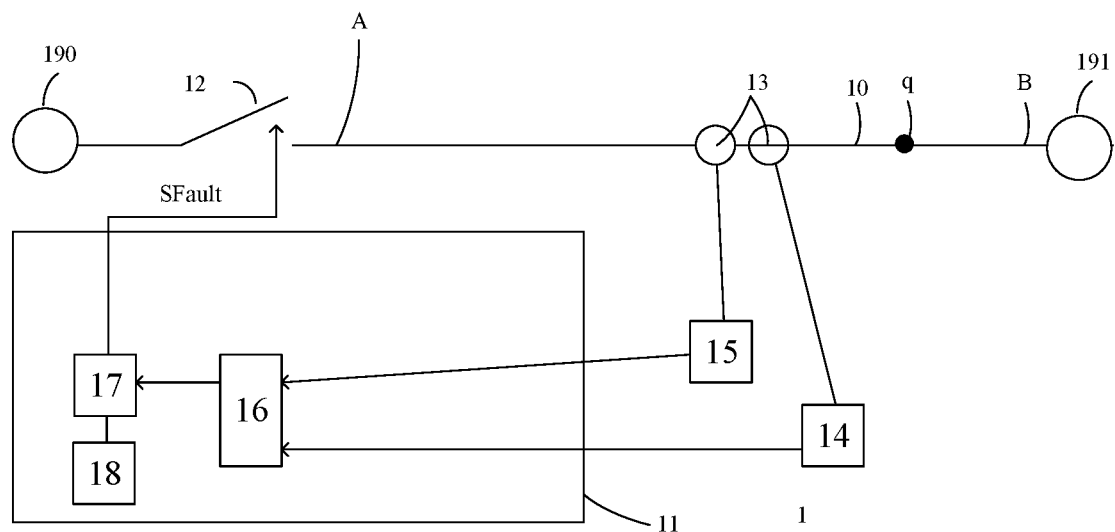
FIG. 1 shows an AC power system according to an embodiment of present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims.

Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

FIG. 1 shows an AC power system according to an embodiment of present invention. As shown in FIG. 1, the AC power system 1 includes a transmission line 10 defined at its two ends A and B. With respect to one of a first end A and a second end B of the transmission line 10, taking the first end A as an example, reverse fault is defined as of the fault occurring to a portion of the AC power system 1 to the opposite side of the transmission line 10; and forward fault is defined as of the fault occurring to a portion of the AC power system 1 at the same side with the transmission line 10. A protective relay 11, in the event of a fault, may disconnect the affected portion of the AC power system, for example by a power circuit breaker 12 where a forward fault is identified.

A first AC source 190 is provided to be connected to the power circuit breaker 12 which further connects with the first end A of the transmission line 10.

Protective relay 11 is provided for this purpose at one of the first end A and the second end B at measurement points 13, for example at the first end A side. Electric signals, such as current and voltage signals, appear at the measurement point 13 is transformed by current transformer 14 and voltage transformer 15 and are fed to the protective relay 11 and sampled by its sampling circuit 16.

The protective relay 11 samples the current and voltage signals by its sampling circuit 16 of an A/D conversion at a series of time points, and performs a fault direction identification, by its controller 17, for the current and voltage sampled values thus generated so as to be able to detect fault direction, either of forward to reverse. In the event of a forward fault, it may be single phase fault of short circuit between a phase and the ground, phase-phase fault of short circuit between any two phases, two phases to ground fault of short circuit between either of two phases and the ground, and three phase fault of short circuits among three phases.

If the protective relay 11 identifies a fault direction, for example by its controller 17, a forward fault signal $S_{fault}$ it indicating the identified fault direction is thus generated by the controller 17, which is used to initiate tripping signal to the power circuit breaker 12 so as to allow said power circuit breaker to open its switching contacts and to disconnect the portion affected by the short circuit from the rest of the energy supply network.

The solutions explained hereinafter is used for fault direction identification using voltage fault component and current fault component at compensation point q on the transmission line 10 (as shown in FIG. 1) based on the current and voltage sampled values, which are established by the principle of time domain lumped parameter differential equation for the transmission line, which will therefore first be explained briefly hereinafter. The compensated point may be midpoint of the transmission line or other pre-set point. The time domain lumped parameter model may be for example an RLC model or an RL model. RLC model is used for an example illustrating the present invention hereinafter.

The RLC model is one of the lumped parameter model and it is an example equivalent model used for the electrical line in the present invention. The RLC model comprises a resistor, an inductor and a capacitor. In other words, the whole transmission line can be represented by an equivalent circuit containing a resistor, an inductor and a capacitor. For illustrative purposes, reference is made to FIG. 2 to describe an example RLC model for a transmission line system.

Figure 2:
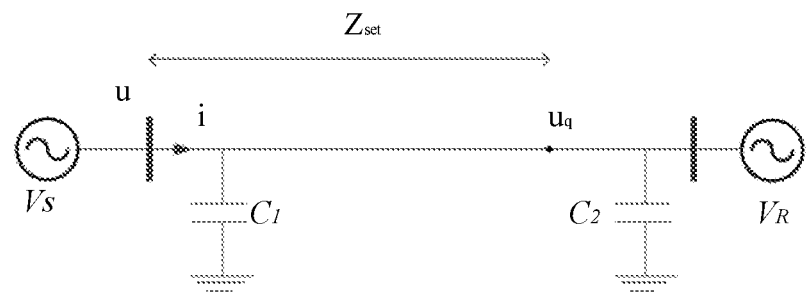
FIG. 2 shows an example RLC model for a transmission line system.

As illustrated in FIG. 2, the RLC model is a standard PI-type line model. The voltage at the start point is denoted by Vs and the voltage at the end point is denoted by $V_R$; the voltage and current at the measurement point are denoted by u and i respectively, the voltage at a setting point is denoted by $u_q$. The transmission line between the start point and the end point can be equivalent to a resistor and an inductor connected in series and two capacitors $C_1$ and $C_2$ which are respectively connected to the start point and the end point of the transmission line.

The impedance of the protection zone can be denoted by $Z_{set}$ in fundamental frequency domain $$Z_{set}=R+jX \quad (1)$$

Where $Z_{set}$ denotes the impedance of the protection zone, R denotes the resistance of the equivalent resistor of the transmission line and X denotes the inductance of the equivalent inductor of the transmission line. It shall be understood that although FIG. 2 illustrates the RLC model as a PI-type RLC model, the present invention is not limited thereto. The RLC model can also be any other forms of RLC model, a T-type RLC model, Tau-type RLC model, or some modified versions thereof. In addition, it may also use a further simplified RL model for the transmission line system.

In some embodiments of the present invention, it can erase a capacitive current in a phase current. That is to say, after a phase current is obtained, at least one of a capacitive current to the ground and a capacitive current between phases can be removed from the obtained phase current.

Figure 3:
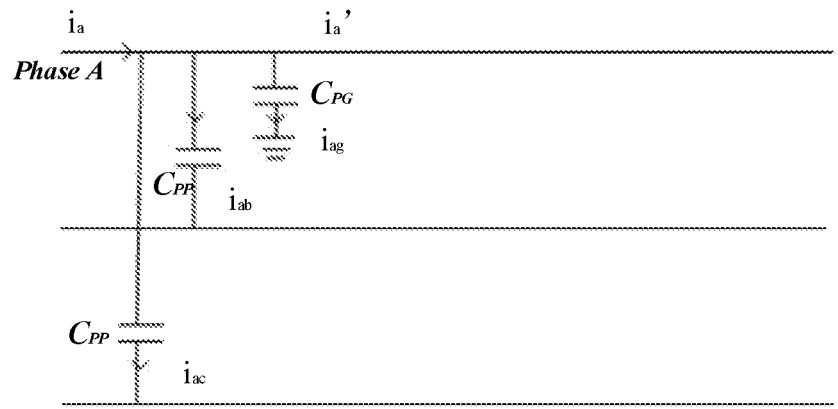
FIG. 3 schematically illustrates of a diagram of a capacitive current path for phase A according to an embodiment of the present invention.

For illustration purposes, FIG. 3 schematically illustrates of a diagram of a capacitive current path for phase A according to an embodiment of the present invention. As illustrated in FIG. 3, for phase A, there is a capacitance $C_{PG}$ of the line for phase A to the ground, a first capacitance $C_{PP}$ between the line for phase A and the line for phase B, and a second capacitance $C_{PP}$ between the line for phase A and the line for phase C. The capacitive currents related to capacitances $C_{PG}$, the first $C_{PP}$ and the second $C_{PP}$ are denoted by $i_{ag}$, $i_{ab}$, $i_{ac}$, respectively. The currents $i_{ag}$, $i_{ab}$, $i_{ac}$ can be obtained by following equations:

$$i_{ag} = C_{PG} \times \frac{du_a}{dt} \tag{2}$$

$$i_{ab} = C_{PP} \times \frac{du_{ab}}{dt} \tag{3}$$

$$i_{ac} = C_{PP} \times \frac{du_{ac}}{dt} \tag{4}$$

wherein $u_a$ represents the phase voltage of phase A; $u_{ab}$ represents a voltage difference between the phase voltage $u_a$ and a phase voltage $u_b$ i.e., $u_{ab}=u_a-u_b$; $u_{ac}$ represents a voltage difference between the phase voltage $u_a$ and a phase voltage $u_c$, i.e., $u_{ac}=u_a-u_c$. Thus, the current $i_a'$, which represents a current of phase A by removing the capacitive current impact can be determined based on the following equations.

$$i_a' = i_a - \left( C_{PG} \times \frac{du_a}{dt} + C_{PP} \times \frac{du_{ab}}{dt} + C_{PP} \times \frac{du_{ac}}{dt} \right) \tag{5}$$

Similarly, currents $i_b'$, $i_c'$ can represent phase currents by removing the capacitive current impact for phase B and phase C, respectively, and they can be determined as follows:

$$i_b' = i_b - \left( C_{PG} \times \frac{du_b}{dt} + C_{PP} \times \frac{du_{ba}}{dt} + C_{PP} \times \frac{du_{bc}}{dt} \right) \tag{6}$$

$$i_c' = i_c - \left( C_{PG} \times \frac{du_c}{dt} + C_{PP} \times \frac{du_{ca}}{dt} + C_{PP} \times \frac{du_{cb}}{dt} \right) \tag{7}$$

wherein $u_b$ represents the voltage of phase B; $u_c$ represents the voltage of phase C; $u_{ba}$ represents the voltage difference between the phase voltage $u_b$ and the phase voltage $u_a$, i.e., $u_{ba}=u_b-u_a$; $u_{ca}$ represents the voltage difference between the phase voltage $u_c$ and the phase voltage $u_a$, i.e., $u_{ca}=u_c-u_a$; $u_{bc}$ represents the voltage difference between the phase voltage $u_b$ and the phase voltage $u_c$ i.e., $u_{bc}=u_b-u_c$; $u_{cb}$ represents the voltage difference between the phase voltage $u_c$ and the phase voltage $u_b$. i.e., $u_{cb}=u_c-u_b$.

Figure 4:
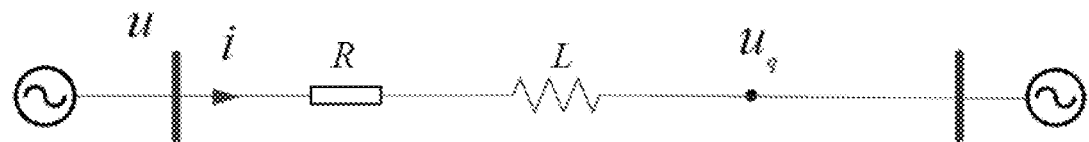
FIG. 4 schematically illustrates a single line diagram for the transmission line according to an embodiment of the present invention.

Thus, in embodiments of the present invention, it may use the current $i_a'$, $i_b'$, $i_c'$, which have subtracted the capacitive currents, instead of the original sampled currents $i_a$, $i_b$, $i_c$. If the capacitive currents are erased from the phase current, then the model of the transmission can be further reduced. For illustration purposes, FIG. 4 schematically illustrates a single line diagram for the transmission line according to an embodiment of the present invention. FIG. 4 is similar to that model as illustrated in FIG. 2, but resistor R and inductor L are illustrated in details and capacitors connected at the start point and the end point are removed since the capacitive currents are removed from the phase current.

Based on the single line diagram as illustrated in FIG. 4, the voltage at the setting point $u_q$ can be determined based on a differential equation such as:

$$u_q(t) = u(t) - R*i(t) - L*\frac{di(t)}{dt} \tag{8}$$

wherein u(t) represents the voltage at the measurement point; i(t) represents the current at the measurement point, R represents a resistance value of a resistor in the lumped parameter model, and L represents an inductance value of an inductor in the lumped parameter model and di(t)/dt represents the differential value of the current i(t). If we consider the discrete time system domain, for example a sample point at time instant k, the following equation (8') can be used to represent the calculation in equation (8).

$$u_{q\_k} = u_k - \left( R \cdot i_k + L \cdot \frac{di_k}{dt} \right) \tag{8'}$$

wherein $u_{q\_k}$ represents the voltage at the setting point; $u_k$ represent the voltage at the measurement point; $i_k$ represents the current at the measurement point and L represents the inductance of inductor in the lumped parameter model (for example the RLC model); R represents the resistance of a resistor in the lumped parameter model (for example the RLC model); $di_k$/dt represents the differential value of the current $i_k$ (dik=ik-ik-1; dt=a sample interval for the given sampling rate; $i_{k-1}$ means the measured current at the time instant k-1 which is previous of time instant k in the discrete time domain)

Figure 5:
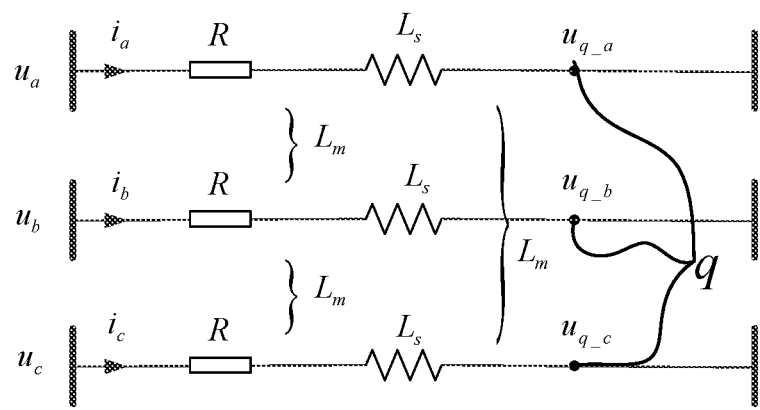
FIG. 5 shows three-phase transmission line diagram.

FIG. 5 shows three-phase transmission line diagram. As shown in FIG. 5, Ls is the phase inductance, Lm is the mutual inductance between phases, and k is the sampling time point. With the three-line diagram, it may determine voltages $u_{q\_a\_k}$, $u_{q\_b\_k}$ and $u_{q\_c\_k}$ based on equation (8) by further taking mutual inductance between phases into consideration. For example, voltage $u_{q\_a\_k}$, $u_{q\_b\_k}$ and $u_{q\_c\_k}$, can be determined based on the differential equation such as:

$$\begin{cases} u_{q\_a\_k} = u_{a\_k} - \left[ R \cdot i_{a\_k} + L_s \cdot \frac{di_{a\_k}}{dt} + L_m \cdot \frac{di_{b\_k}}{dt} + L_m \cdot \frac{di_{c\_k}}{dt} \right] \\ u_{q\_b\_k} = u_{b\_k} - \left[ R \cdot i_{b\_k} + L_s \cdot \frac{di_{b\_k}}{dt} + L_m \cdot \frac{di_{a\_k}}{dt} + L_m \cdot \frac{di_{c\_k}}{dt} \right] \\ u_{q\_c\_k} = u_{c\_k} - \left[ R \cdot i_{c\_k} + L_s \cdot \frac{di_{c\_k}}{dt} + L_m \cdot \frac{di_{a\_k}}{dt} + L_m \cdot \frac{di_{b\_k}}{dt} \right] \end{cases} \tag{9}$$

wherein $u_{a\_k}$, $u_{b\_k}$ and $u_{c\_k}$ respectively represents line voltages for phase A, phase B and phase C at the measurement point; $i_{a\_k}$, $i_{b\_k}$ and $i_{c\_k}$ respectively represents currents for phase A, phase B and phase C at the measurement point; $L_s$ represents the phase inductance for phase A, phase B and phase C; and $L_m$ represents the inductance between phases for phase A, phase B and phase C.

Since the phase to phase voltage is a voltage difference between one phase and another phase, thus the phase-to-phase voltages $u_{q\_ab\_k}$, $u_{q\_bc\_k}$ and $u_{q\_ca\_k}$ can be further determined based on the phase voltages $u_{q\_a\_k}$, $u_{q\_b\_k}$ and $u_{q\_c\_k}$ determined based on equation (9). For example, the voltage $u_{q\_b\_k}$, i.e. the voltage between phase A and B at the setting point, can determined by:

$$u_{q\_ab\_k} = u_{q\_a\_k} - u_{q\_b\_k} = u_{ab\_k} - \left[ R \cdot i_{ab\_k} + (L_s - L_m) \cdot \frac{di_{ab\_k}}{dt} \right] \tag{10}$$

-continued $$= u_{ab\_k} - \left[ R \cdot i_{ab\_k} + L \cdot \frac{di_{ab\_k}}{dt} \right]$$

wherein $u_{ab\_k}$, $i_{ab\_k}$ respectively represent the voltage and current between phase A and phase B at the measurement point; R and L mean a positive sequence resistance and inductance for the phase line, L equals to the difference of Ls and Lm, i.e., $L=L_s-L_m$.

In equation (10), R and L are positive sequence resistance and inductance, $L=L_s-L_m$. Similarly, the voltages $u_{q\_bc\_k}$ and $u_{q\_ca\_k}$ can be computed too. According to the differential equation (10), the phase-to-phase voltages $u_{q\_ab\_k}$, $u_{q\_bc\_k}$ and $u_{q\_ca\_k}$ can be determined by the differential equation (11).

Equation (11) summarized the computation for these three phase-to-phase loop voltages, R and L in Equation (11) are positive sequence resistance and inductance:

$$\begin{cases} u_{q\_ab\_k} = u_{ab\_k} - \left( R \cdot i_{ab\_k} + L \cdot \frac{di_{ab\_k}}{dt} \right) \\ u_{q\_bc\_k} = u_{bc\_k} - \left( R \cdot i_{bc\_k} + L \cdot \frac{di_{bc\_k}}{dt} \right) \\ u_{q\_ca\_k} = u_{ca\_k} - \left( R \cdot i_{ca\_k} + L \cdot \frac{di_{ca\_k}}{dt} \right) \end{cases} \quad (11)$$

wherein $u_{ab\_k}$, $i_{ab\_k}$ respectively represents the voltage and current between phase A and phase B at the measurement point; $u_{bc\_k}$, $i_{bc\_k}$ respectively represent the voltage and current between phase B and phase C at the measurement point; $u_{ca\_k}$, $i_{ca\_k}$ respectively represent the voltage and current between phase C and phase A at the measurement point; R and L mean the positive sequence resistance and inductance for the phase line, L equals to the difference of $L_s$ and Lm, i.e., $L=L_s-L_m$. Thus, we can determine the phase voltage $u_{q\_a\_k}$, $u_{q\_b\_k}$ and $u_{q\_c\_k}$ and the phase-to-phase voltages $u_{q\_ab\_k}$, $u_{q\_bc\_k}$ and $u_{q\_ca\_k}$. It shall be understood that although the phase voltages $u_{q\_a\_k}$, $u_{q\_b\_k}$ and $u_{q\_c\_k}$ and the phase-to-phase voltages $u_{q\_ab\_k}$, $u_{q\_bc\_k}$ and $u_{q\_ca\_k}$ are described as to be determined based on equation (9) and (11) respectively, the present invention is not limited to these embodiments. In fact, it is possible to use any suitable form of differential equations.

For the phase-ground loop, voltages $u_{q\_a\_k}$, $u_{q\_b\_k}$ and $u_{q\_c\_k}$ at the compensation point q are computed by equation (9). Furthermore, these three voltages at the compensation point q can be computed by equation (12), R and L in Equation (12) are positive sequence resistance and inductance, the deduction process is not described here for the simplicity and clarity.

$$\begin{cases} u_{q\_a\_k} = u_{a\_k} - \left[ R \cdot (i_{a\_k} + k_R \cdot 3i_{0\_k}) + L \cdot \frac{d(i_{a\_k} + k_L \cdot 3i_{0\_k})}{dt} \right] \\ u_{q\_b\_k} = u_{b\_k} - \left[ R \cdot (i_{b\_k} + k_R \cdot 3i_{0\_k}) + L \cdot \frac{d(i_{b\_k} + k_L \cdot 3i_{0\_k})}{dt} \right] \\ u_{q\_c\_k} = u_{c\_k} - \left[ R \cdot (i_{c\_k} + k_R \cdot 3i_{0\_k}) + L \cdot \frac{d(i_{c\_k} + k_L \cdot 3i_{0\_k})}{dt} \right] \\ k_R = \frac{R_0 - R_1}{3R_1} \quad k_L = \frac{L_0 - L_1}{3L_1} \end{cases} \quad (12)$$

wherein $R_0$ represents zero sequence resistance of the three-phase transmission line; $R_1$ represents positive sequence resistance of the three-phase transmission line; $L_0$ represents zero sequence inductance of the three-phase transmission line; $L_1$ represents positive sequence inductance of the three-phase transmission line; $i_{0\_k}$, represents zero sequence current at instant k, $K_R$ represents a factor determined based on $R_0$, $R_1$ as indicated in equation (12); $K_L$ represents a factor determined based on $L_0$, $L_1$ as indicated in equation (12).

Based on the principle of time domain lumped parameter differential equation for the transmission line, instantaneous voltage values at the compensation point q can be calculated from the sampling current values and voltage values at one end of the transmission line 10 for a series of time points, including three instantaneous voltage values $u_{q\_a\_k}$, $u_{q\_b\_k}$ and $u_{q\_c\_k}$ of phase-ground loop electric signals and three instantaneous voltage values $u_{q\_ab\_k}$, $u_{q\_bc\_k}$ and $u_{q\_ca\_k}$ of phase-phase loop electric signals. Namely, a mathematical link can be established based on the relations between the values of the sampled electric signals measured at the measurement point 13 and computed instantaneous voltage values at the compensation point q.

Voltage fault component of any of the six electrical loops at the compensation point q for sampling instant k can be computed from any of the equations (13-1) to (13-4) as below. The six electrical loop includes phase A to ground, phase B to ground, phase C to ground, phase A to phase B, phase B to phase C, and phase C to phase A.

$$\Delta u_{q\_k} = u_{q\_k} + u_{q\_k-N/2} \quad (13\text{-}1)$$

$$\Delta u_{q\_k} = [u_{q\_k} + u_{q\_k-N/2}] - [u_{q\_k-N} + u_{q\_k-3N/2}] \quad (13\text{-}2)$$

$$\Delta u_{q\_k} = u_{q\_k} - u_{q\_k-N} \quad (13\text{-}3)$$

$$\Delta u_{q\_k} = [u_{q\_k} - u_{q\_k-N}] - [u_{q\_k-N} - u_{q\_k-2N}] \quad (13\text{-}4)$$

wherein $\Delta u_{q\_k}$ indicates the voltage fault component of any of the six electrical loops at the compensation point q for sampling instant k, $u_{q\_k}$ indicates the voltage value of any of the six electrical loops at the compensation point q for sampling instant k, N indicates the number of sampling instant, preferably being equal to the number of sampling instant during the AC power system fundamental frequency cycle. In particular case such as for the electrical loop of phase A to ground, subscript "q_a" may be used in replacement of "q_" in equations (13-1) to (13-4), and symbol "$\Delta u_{q\_k}$" changes to "$\Delta u_{q\_a\_k}$". For the phase B to ground, phase C to ground, phase A to phase B, phase B to phase C, and phase C to phase A, "$\Delta u_{q\_b\_k}$", "$\Delta u_{q\_c\_k}$", "$\Delta u_{q\_ab\_k}$", "$\Delta u_{q\_bc\_k}$", "$\Delta u_{q\_ca\_k}$" would be used in the specific scenarios.

Similarly, current fault component of any of the six electrical loops at the compensation point q for sampling instant k can be computed from any of the equations (14-1) to (14-4) as below. The six electrical loop includes phase A to ground, phase B to ground, phase C to ground, phase A to phase B, phase B to phase C, and phase C to phase A.

$$\Delta i_{q\_k} = i_{q\_k} + i_{q\_k-N/2} \quad (14\text{-}1)$$

$$\Delta i_{q\_k} = [i_{q\_k} + i_{q\_k-N/2}] - [i_{q\_k-N} + i_{q\_k-3N/2}] \quad (14\text{-}2)$$

$$\Delta i_{q\_k} = i_{q\_k} - i_{q\_k-N} \quad (14\text{-}3)$$

$$\Delta i_{q\_k} = [i_{q\_k} - i_{q\_k-N}] - [i_{q\_k-N} - i_{q\_k-2N}] \quad (14\text{-}4)$$

wherein $\Delta i_{q\_k}$ indicates the current fault component of any of the six electrical loops at the compensation point q for sampling instant k, $i_{q\_k}$ indicates the current value of any of the six electrical loops at the compensation point q for the sampling instant k, N indicates the number of sampling instant, preferably being equal to the number of sampling instant during the AC power system fundamental frequency cycle. In particular case such as for the electrical loop of phase A to ground, subscript "q_a" may be used in replacement of "q_" in equations (14-1) to (14-4), and symbol "$\Delta i_{q\_k}$" changes to "$\Delta i_{q\_a\_k}$". For the phase B to ground, phase C to ground, phase A to phase B, phase B to phase C, and phase C to phase A, "$\Delta i_{q\_b\_k}$", "$\Delta i_{q\_c\_k}$", "$\Delta i_{q\_ab\_k}$", "$\Delta i_{q\_bc\_k}$", "$\Delta i_{q\_ca\_k}$" would be used in the specific scenarios.

From the principle of electrical circuit, because the current flowing at the end of the transmission line is equal to that flowing the compensation point q, the sampling current values at the end of the transmission line can be used for the compensation point. Thus, the equations (14-1) to (14-4) can be reformulated as the equations (15-1) to (15-4).

$$\Delta i_{q\_k} = i_{e\_k} + i_{e\_k-N/2} \quad (15\text{-}1)$$

$$\Delta i_{q\_k} = [i_{e\_k} + i_{e\_k-N/2}] - [i_{e\_k-N} + i_{e\_k-3N/2}] \quad (15\text{-}2)$$

$$\Delta i_{q\_k} = i_{e\_k} - i_{e\_k-N} \quad (15\text{-}3)$$

$$\Delta i_{q\_k} = [i_{e\_k} - i_{e\_k-N}] - [i_{e\_k-N} - i_{e\_k-2N}] \quad (15\text{-}4)$$

wherein $i_{e\_k}$ indicates the sampled current value of any of the six electrical loops at the end of the transmission line for sampling instant k. In particular case such as for the electrical loop of phase A to ground, subscript "q_a" may be used in replacement of "q_" and "e_" in equations (15-1) to (15-4), and symbol "$\Delta i_{q\_k}$" and "$\Delta i_{e\_k}$" change to "$\Delta i_{q\_a\_k}$" and "$\Delta i_{e\_a\_k}$". For the phase B to ground, phase C to ground, phase A to phase B, phase B to phase C, and phase C to phase A, "$\Delta i_{q\_b\_k}$", "$\Delta i_{e\_b\_k}$", "$\Delta i_{q\_c\_k}$", "$\Delta i_{e\_c\_k}$", "$\Delta i_{q\_ab\_k}$", "$\Delta i_{e\_ab\_k}$", "$\Delta i_{q\_bc\_k}$", "$\Delta i_{e\_bc\_k}$", "$\Delta i_{q\_ca\_k}$", "$\Delta i_{e\_ca\_k}$" would be used in the specific scenarios.

Figure 6:
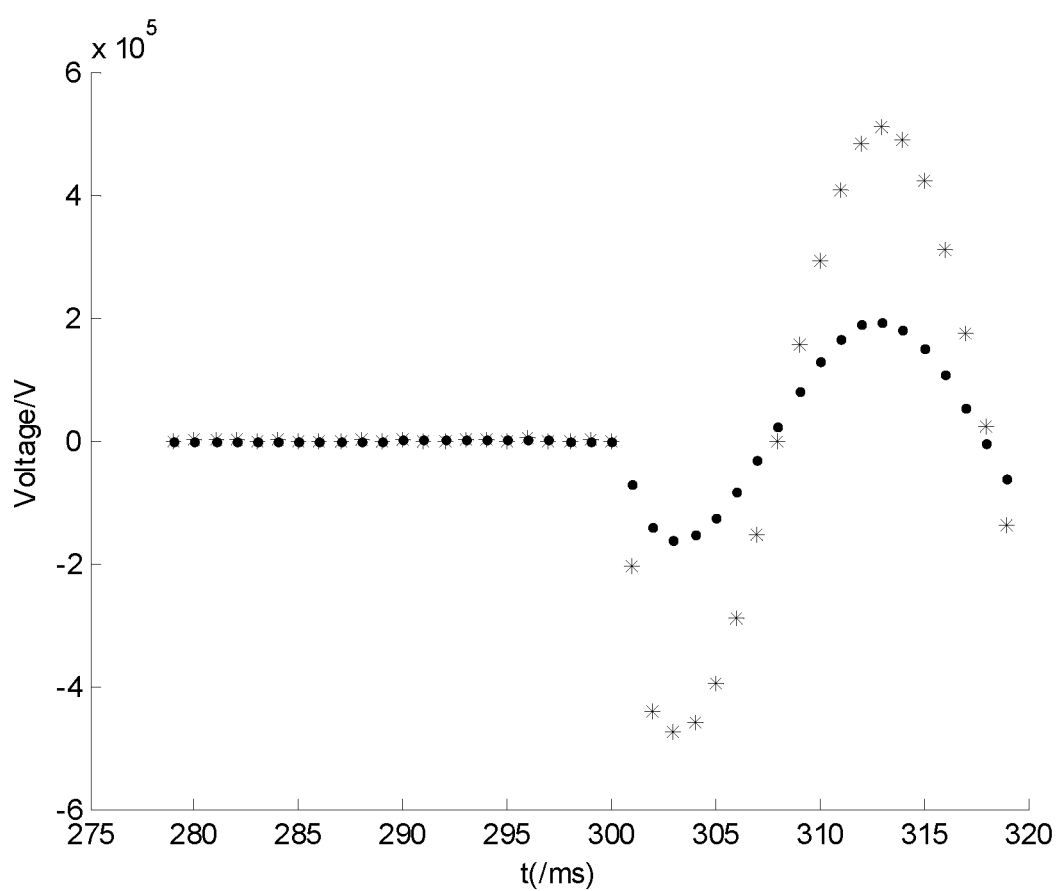
FIG. 6 shows simulation results of voltage fault component calculated from the voltage value samples at one end of the transmission line and that calculated from the voltage values at the compensated point of the transmission line under forward fault of a strong AC power system.

FIG. 6 shows simulation results of voltage fault component calculated from the voltage value samples at one end of the transmission line and that calculated from the voltage values at the compensated point of the transmission line under forward fault of a strong AC power system. In order to simplify the analysis, in the simulation, the angle of system impedance is equal to the angle of line impedance. The voltage values at the compensated point of the transmission line, as described above, are computed from the voltage value samples based on a time domain lumped parameter differential equation for the transmission line for the series of time points.

As shown in FIG. 6, dot indicates the discrete value for the voltage fault component at the transmission line end, and asterisk indicates the discrete value for the voltage fault component at the compensated point on the transmission line. The two groups of discrete values exhibit a positive correlation in the time domain, the discrete values for the same sampling instant of the two groups having the same polarity for a predetermined time period. Furthermore, for any sampling instant of the predetermined time period, the discrete value of the voltage fault component at the compensated point always has a larger amplitude than that of the voltage fault component at the one end of the transmission line. A larger magnitude is more easily to be detected than a smaller one, especially in a strong AC power system where the voltage fault components at the one end of the transmission line have insignificant amplitudes. In consideration of such positive correlation and the larger amplitudes of the discrete values of the voltage fault components at the compensated point, by observing the voltage fault components at the compensated point rather than the voltage fault components at the one end of the transmission line, the fault information may be identified accurately from significant signals. Where a fault directional element is designed using the voltage fault components at the compensated point, it will work well for the AC power system with strong power source.

Blow are embodiments describing detection of fault direction of the transmission line by using the voltage fault components at the compensated point.

As shown in FIG. 1 and following the description as above, common to the various embodiments: the sampling circuit 16 is adapted for sampling current values $i_{a\_k}$, $i_{b\_k}$, $i_{c\_k}$ and voltage values $u_{a\_k}$, $u_{b\_k}$, $u_{c\_k}$ at one end A of the transmission line 10 for a series of time points; the sampled current and voltage or their differential values may involve any of the six electrical loops including phase A to ground, phase B to ground, phase C to ground, phase A to phase B, phase B to phase C, and phase C to phase A; an interval of the series of time points is less than AC power system fundamental frequency cycle, for example 1 ms.

the controller 17 is adapted for computing instantaneous voltage values $u_{q\_a\_k}$, $u_{q\_b\_k}$, $u_{q\_c\_k}$ at compensated point q on the transmission line 10 from the current value samples $i_{a\_k}$, $i_{b\_k}$, $i_{c\_k}$ and the voltage value samples $u_{a\_k}$, $u_{b\_k}$, $u_{c\_k}$ based on a time domain lumped parameter differential equation for the transmission line for the series of time points; and the storage circuit 18 is adapted for recording the current value samples $i_{a\_k}$, $i_{b\_k}$, $i_{c\_k}$ and the computed instantaneous voltage values $u_{q\_a\_k}$, $u_{q\_b\_k}$, $u_{q\_c\_k}$ at the compensated point q; the controller 17 is further adapted for computing at least one voltage fault component $\Delta u_{q\_a\_k}$, $\Delta u_{q\_b\_k}$, $\Delta u_{q\_c\_k}$, $\Delta u_{q\_ab\_k}$, $\Delta u_{q\_bc\_k}$, $\Delta u_{q\_ca\_k}$ each using the recorded computed instantaneous voltage values for at least two of the series of time points as shown in the description accompanying equations (13-1) to (13-4). For example, in equations (13-1) and (13-3), two of the series of time points are considered, k and k−N/2 or k and k−N, for the rest of the equations, more than two of the series of time points are considered, k, k−N/2, k−N and k−3N/2 or k, k−N and k−2N.

It further being adapted for computing at least one current fault component $\Delta i_{q\_a\_k}$, $\Delta i_{q\_b\_k}$, $\Delta i_{q\_c\_k}$, $\Delta i_{q\_ab\_k}$, $\Delta i_{q\_bc\_k}$, $\Delta i_{q\_ca\_k}$ each using the recorded current value samples for the at least two of the series of time points as shown in the description accompanying equations (15-1) to (15-4). For example, in equations (15-1) and (15-3), two of the series of time points are considered, k and k−N/2 or k and k−N, for the rest of the equations, more than two of the series of time points are considered, k, k−N/2, k−N and k−3N/2 or k, k−N and k−2N. More than two sampling instants will be used to calculate the faulted component for its better performance for unbalanced current reduction especially in the conditions of harmonics, shift of power frequency and power swing; the controller 17 is further adapted for using the fault directional element involving the at least one computed voltage fault component $\Delta u_{q\_a\_k}$, $\Delta u_{q\_b\_k}$, $\Delta u_{q\_c\_k}$, $\Delta u_{q\_ab\_k}$, $u_{q\_bc\_k}$, $\Delta u_{q\_ca\_k}$ and the at least one computed current fault component $\Delta i_{q\_a\_k}$, $\Delta i_{q\_b\_k}$, $\Delta i_{q\_c\_k}$, $\Delta i_{q\_ab\_k}$, $\Delta i_{q\_bc\_k}$, $\Delta i_{q\_ca\_k}$, and generating a fault direction signal indicating the identified fault direction.

The identified fault direction is related to the fault occurring in an electrical loop of the transmission line, and the current value samples and the voltage value samples are measurements concerning the electrical loop of the transmission line.

The embodiments of present invention may use various fault directional element for identification of the fault direction of the transmission line.

EMBODIMENT I

The fault directional element uses a relation of signs of the computed voltage fault component $\Delta u_{q\_a\_k}$, $\Delta u_{q\_b\_k}$, $\Delta u_{q\_c\_k}$, $\Delta u_{q\_ab\_k}$, $\Delta u_{q\_bc\_k}$, $\Delta u_{q\_ca\_k}$ and the computed current fault component $\Delta i_{q\_a\_k}$, $\Delta i_{q\_b\_k}$, $\Delta i_{q\_c\_k}$, $\Delta i_{q\_ab\_k}$, $\Delta i_{q\_bc\_k}$, $\Delta i_{q\_ca\_k}$. For example, for phase A to ground, the fault direction is identified as forward where signs of the computed voltage fault component $\Delta u_{q\_a\_k}$ and the computed current fault component $\Delta i_{q\_a\_k}$ are opposite to each other, and the fault direction is identified as reverse where signs of the computed voltage fault component and the computed current fault component are the same.

This holds true for the rest of the electric loops B to ground, phase C to ground, phase A to phase B, phase B to phase C, and phase C to phase A.

EMBODIMENT II

The fault directional element uses an energy directional element involving the computed voltage fault component $\Delta u_{q\_a\_k}$, $\Delta u_{q\_b\_k}$, $\Delta u_{q\_c\_k}$, $\Delta u_{q\_ab\_k}$, $\Delta u_{q\_bc\_k}$, $\Delta u_{q\_ca\_k}$ and the computed current fault component $\Delta i_{q\_a\_k}$, $\Delta i_{q\_b\_k}$, $\Delta i_{q\_c\_k}$, $\Delta i_{q\_ab\_k}$, $\Delta i_{q\_bc\_k}$, $\Delta i_{q\_ca\_k}$.

The energy directional element of the transient energy detected by the protective relay 11 should be negative for forward fault and positive for reverse fault under a predetermined time period, for example 1-10 ms. During such time period, the positive correlation between the voltage fault component at the compensated point and that of the voltage fault component at the one end of the transmission line is sustained and the former exhibits a larger magnitude than the latter. Thus, due to the analysis in the foregoing description, the embodiment of present invention will work well for the AC power system with strong power source.

The calculation of the transient energy is shown in equation (16) for the six electrical loops.

$$\begin{cases} S_{Da} = \sum_{k-n}^{k} \Delta u_{q\_a\_k} \cdot \Delta i_{a\_k} \\ S_{Db} = \sum_{k-n}^{k} \Delta u_{q\_b\_k} \cdot \Delta i_{b\_k} \\ S_{Dc} = \sum_{k-n}^{k} \Delta u_{q\_c\_k} \cdot \Delta i_{c\_k} \\ S_{Dab} = \sum_{k-n}^{k} \Delta u_{q\_ab\_k} \cdot \Delta i_{ab\_k} \\ S_{Dbc} = \sum_{k-n}^{k} \Delta u_{q\_bc\_k} \cdot \Delta i_{bc\_k} \\ S_{Dca} = \sum_{k-n}^{k} \Delta u_{q\_ca\_k} \cdot \Delta i_{ca\_k} \end{cases} \quad (16)$$

Wherein: $S_{Da}$, $S_{Db}$, $S_{Dc}$, $S_{Dab}$, $S_{Dbc}$, $S_{Dca}$ respectively indicate the fault directional elements of electrical loops of phase A to ground, phase B to ground, phase C to ground, phase A to phase B, phase B to phase C, and phase C to phase A.

In order to avoid mal-operation and increase the liability, the generation of the fault direction signal is triggered by an absolute value of the computed energy directional elements being above a predetermined threshold.

Taking the electrical loop of phase A to ground as an example, the following threshold to judge the polarity of $$\begin{cases} S_D > S_{threshold} & \text{Reverse} \\ S_D < -S_{threshold} & \text{Forward} \end{cases} \quad (17)$$

$S_D > S_{threshold}$ may be regarded as reverse fault scenario while $S_D < -S_{threshold}$ may be regarded as forward fault scenario.

This holds true for the rest of the electric loops B to ground, phase C to ground, phase A to phase B, phase B to phase C, and phase C to phase A.

EMBODIMENT III

The fault directional element uses a multiple of energy directional elements involving different electrical loops.

In theory and verified by the simulation, the energy directional elements for the three phase-phase electrical loops, $S_{Dab}$, $S_{Dbc}$, $S_{Dca}$, have the same polarity for most case. An exception is the single phase to ground faults. For example, if phase A is grounded, the amplitude of $S_{Dbc}$ is close to zero because it has nothing to do with this fault and its polarity is uncertain because the value is too small.

In order to simplify the implementation, we can calculate the sum of $S_{Dab}$, $S_{Dbc}$, $S_{Dca}$ of 3 phase-to-phase loops then use this result to determine fault direction according to equation (18).

$$S_{D\Sigma} = S_{Dab} + S_{Dbc} + S_{Dca} \quad (18)$$

The fault direction is identified as reverse where sign of sum of the computed energy directional elements $S_{D\Sigma}$ is positive under the predetermined time period, and the fault direction is identified as forward where sign of sum of the computed energy directional elements $S_{D\Sigma}$ is negative under the predetermined time period.

The computed energy directional elements $S_{D\Sigma}$ may use the energy directional elements for other electrical loops substituting the energy directional elements for the three phase-phase electrical loops, $S_{Dab}$, $S_{Dbc}$, $S_{Dca}$, for example the energy directional elements for three phase-ground, $S_{Dab}$, $S_{Dbc}$, $S_{Dca}$.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A method for detecting fault direction of transmission line of an AC power system, the method comprising:
    sampling current values and voltage values at one end of the transmission line for a series of time points;
    computing instantaneous voltage values at compensated point on the transmission line from the current value samples and the voltage value samples based on a time domain lumped parameter differential equation for the transmission line for the series of time points;
    recording the current value samples and the computed instantaneous voltage values at the compensated point;

computing at least one voltage fault component each using the recorded computed instantaneous voltage values for at least two of the series of time points;

computing at least one current fault component each using the recorded current value samples for the at least two of the series of time points;

identifying the fault direction in consideration of the at least one computed voltage fault component and the at least one computed current fault component; and generating a fault direction signal indicating the identified fault direction.

2. The method according to claim 1, wherein:

the fault direction is identified as forward where signs of the computed voltage fault component and the computed current fault component are opposite to each other; and the fault direction is identified as reverse where signs of the computed voltage fault component and the computed current fault component are the same.

3. The method according to claim 1, wherein:

the fault direction is identified as forward where an energy directional element involving the computed voltage fault component and the computed current fault component is negative under a predetermined time period; and the fault direction is identified as reverse where an energy directional element involving the computed voltage fault component and the computed current fault component is positive under a predetermined time period.

4. The method according to claim 3, further comprising:

computing a plurality of energy directional elements involving different electrical loops;

wherein the fault direction is identified as forward where sign of sum of the computed energy directional elements is negative under predetermined time period; and wherein the fault direction is identified as reverse where sign of sum of the computed energy directional elements is positive under predetermined time period.

5. The method according to claim 1, wherein:

the identified fault direction is related to the fault occurring in an electrical loop of the transmission line; and the current value samples and the voltage value samples are measurements concerning the electrical loop of the transmission line.

6. The method according to claim 1, further comprising:

computing a plurality of energy directional elements involving different electrical loops, wherein the generation of the fault direction signal is triggered by an absolute value of the computed energy directional elements being above a predetermined threshold.

7. The method according to claim 1, wherein:

the computed instantaneous voltage values indicate one of three-phase voltages at the compensated point on the transmission line; and the current value samples indicate corresponding one of three-phase currents measured at the end of the transmission line.

8. A control system for detecting fault direction of transmission line of an AC power system, the system comprising:

a sampling circuit configured to sample current values and voltage values at one end of the transmission line for a series of time points;

a storage circuit;

a controller operational to:

compute instantaneous voltage values at a compensated point on the transmission line from the current value samples and the voltage value samples based on a time domain lumped parameter differential equation for the transmission line for the series of time points;

cause the current value samples and the computed instantaneous voltage values at the compensated point be recorded in the storage circuit;

compute at least one voltage fault component each using the recorded computed instantaneous voltage values for at least two of the series of time points;

computer at least one current fault component each using the recorded current value samples for the at least two of the series of time points;

identify the fault direction in consideration of the at least one computed voltage fault component and the at least one computed current fault component; and generate a fault direction signal indicating the identified fault direction.

9. The control system according to claim 8, wherein:

the fault direction is identified as forward where signs of the computed voltage fault component and the computed current fault component are opposite to each other; and the fault direction is identified as reverse where signs of the computed voltage fault component and the computed current fault component are the same.

10. The control system according to claim 8, wherein:

the fault direction is identified as forward where an energy directional element involving the computed voltage fault component and the computed current fault component is negative under a predetermined time period; and the fault direction is identified as reverse where an energy directional element involving the computed voltage fault component and the computed current fault component is positive under a predetermined time period.

11. The control system according to claim 10, wherein:

the controller is operational for a plurality of energy directional elements involving different electrical loops;

the fault direction is identified as forward where sign of sum of the computed energy directional elements is negative under predetermined time period; and the fault direction is identified as reverse where sign of sum of the computed energy directional elements is positive under predetermined time period.

12. The control system according to claim 8, wherein:

the identified fault direction is related to the fault occurring in an electrical loop of the transmission line; and the current value samples and the voltage value samples are measurements concerning the electrical loop of the transmission line.

13. The control system according to claim 8, wherein:

the generation of the fault direction signal is triggered by an absolute value of computed energy directional elements being above a predetermined threshold.

14. The control system according to claim 8, wherein:

the computed instantaneous voltage values indicate one of three-phase voltages at the compensated point on the transmission line; and the current value samples indicate corresponding one of three-phase currents measured at the end of the transmission line.

15. The method according to claim 4, wherein:

the identified fault direction is related to the fault occurring in an electrical loop of the transmission line; and the current value samples and the voltage value samples are measurements concerning the electrical loop of the transmission line.

16. The method according to claim 2, wherein:

the identified fault direction is related to the fault occurring in an electrical loop of the transmission line; and the current value samples and the voltage value samples are measurements concerning the electrical loop of the transmission line.

17. The method according to claim 5, further including:

computing a plurality of energy directional elements involving different electrical loops, wherein the generation of the fault direction signal is triggered by an absolute value of the computed energy directional elements being above a predetermined threshold.

18. The control system according to claim 11, wherein:

the identified fault direction is related to the fault occurring in an electrical loop of the transmission line; and the current value samples and the voltage value samples are measurements concerning the electrical loop of the transmission line.

19. The control system according to claim 9, wherein:

the controller is operational for a plurality of energy directional elements involving different electrical loops; and the generation of the fault direction signal is triggered by an absolute value of the energy directional elements being above a predetermined threshold.

20. The control system according to claim 9, wherein:

the identified fault direction is related to the fault occurring in an electrical loop of the transmission line; and the current value samples and the voltage value samples are measurements concerning the electrical loop of the transmission line.

\* \* \* \* \*